United States Patent
Weber et al.

(10) Patent No.: US 7,867,879 B2
(45) Date of Patent: Jan. 11, 2011

(54) METHOD FOR DIVIDING A SEMICONDUCTOR SUBSTRATE AND A METHOD FOR PRODUCING A SEMICONDUCTOR CIRCUIT ARRANGEMENT

(75) Inventors: Hans Weber, Bayerisch Gmain (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/188,232

(22) Filed: Aug. 8, 2008

(65) Prior Publication Data
US 2009/0061595 A1    Mar. 5, 2009

(30) Foreign Application Priority Data
Sep. 4, 2007   (DE) ................ 10 2007 041 885

(51) Int. Cl.
*H01L 21/304* (2006.01)
(52) U.S. Cl. ............... 438/462; 257/E21.237
(58) Field of Classification Search .......... 438/459–465
See application file for complete search history.

(56) References Cited

U.S. PATENT DOCUMENTS

| 6,472,254 B2* | 10/2002 | Cantarini et al. ............ 438/138 |
| 2003/0143819 A1* | 7/2003 | Hedler et al. ............... 438/462 |
| 2003/0153125 A1* | 8/2003 | Ueda et al. .................. 438/113 |
| 2006/0128119 A1* | 6/2006 | Saito et al. .................. 438/460 |
| 2008/0318396 A1* | 12/2008 | Shin et al. ................... 438/462 |

FOREIGN PATENT DOCUMENTS

| DE | 10 2006 037 789 A1 | 2/2008 |
| DE | 102006046869 | * 4/2008 |
| JP | 10022378 A | 1/1998 |

* cited by examiner

*Primary Examiner*—Savitri Mulpuri
(74) *Attorney, Agent, or Firm*—SpryIP, LLC

(57) ABSTRACT

A method for dividing a semiconductor substrate involves providing a semiconductor substrate. At least one separating trench is produced at a front side of the semiconductor substrate. A layer is produced at least at the bottom of the at least one separating trench. The semiconductor substrate is thinned at a rear side of the semiconductor substrate at least as far as the layer at the bottom of the at least one separating trench. The layer is severed in order to divide the semiconductor substrate into individual pieces.

16 Claims, 4 Drawing Sheets

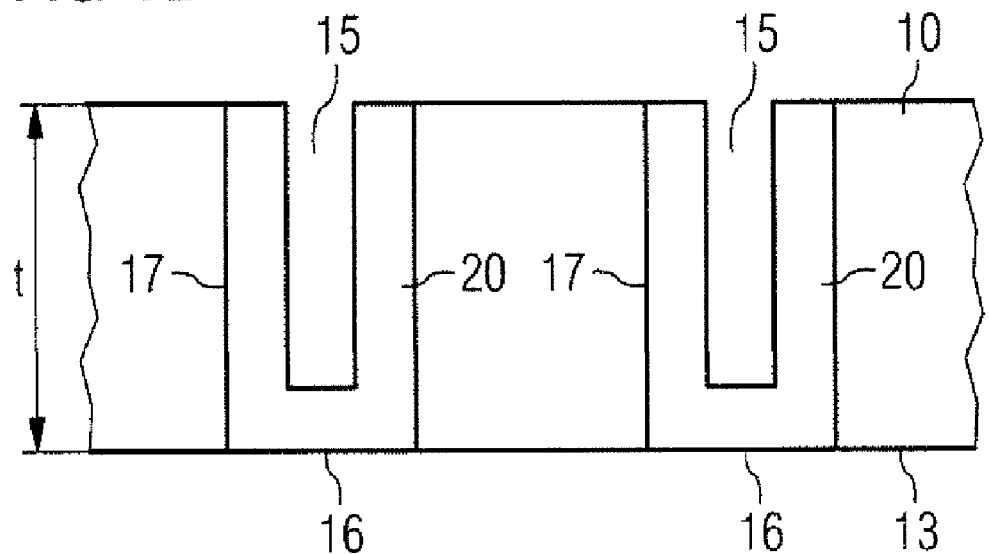
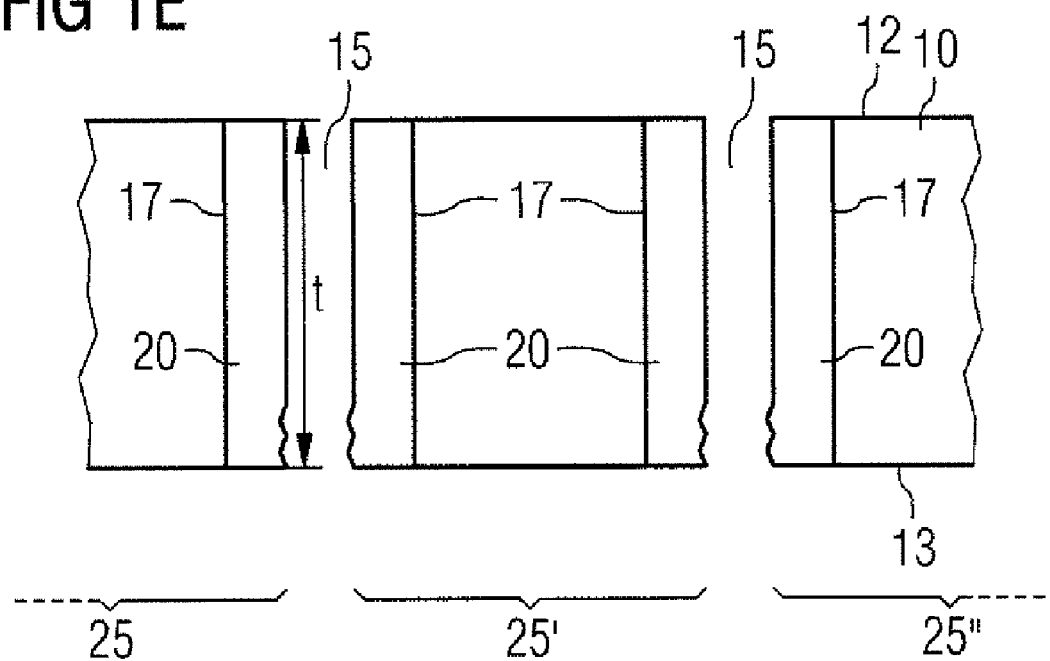

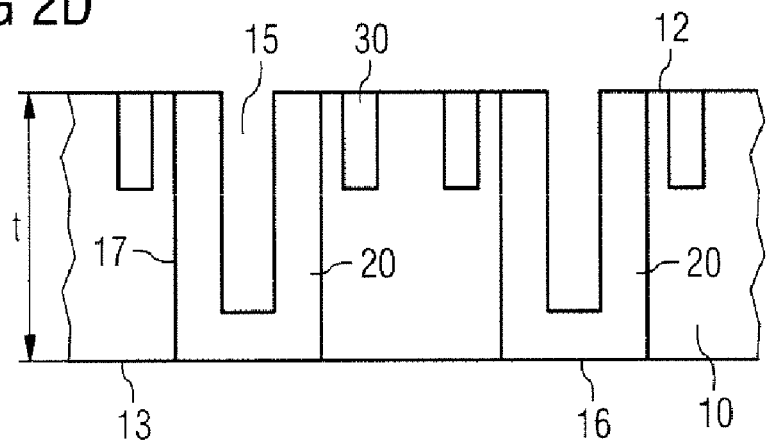
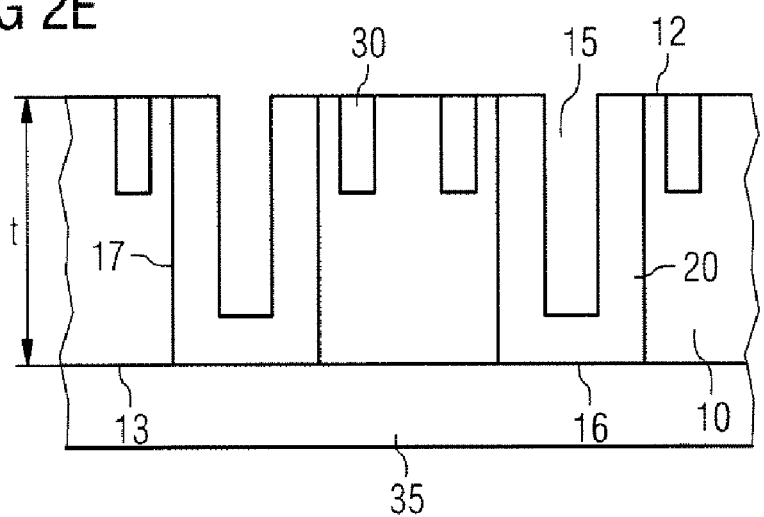
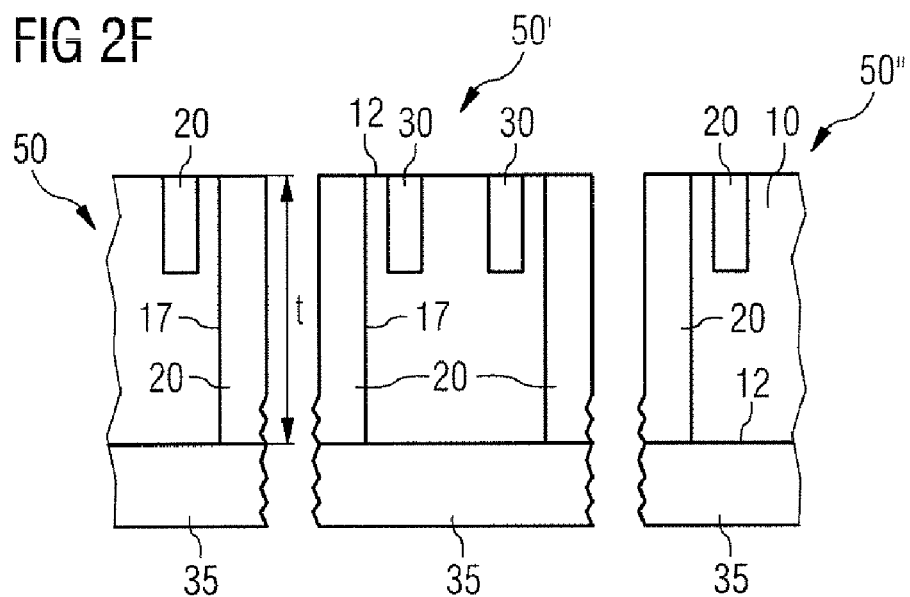

METHOD FOR DIVIDING A SEMICONDUCTOR SUBSTRATE AND A METHOD FOR PRODUCING A SEMICONDUCTOR CIRCUIT ARRANGEMENT

RELATED APPLICATION

The present application claims priority to German Application No. 10 2007 041 885 filed Sep. 4, 2007, which is incorporated by reference herein in its entirety.

FIELD OF THE INVENTION

Exemplary embodiments of the invention relate to a method for dividing a thinned semiconductor substrate by means of separating trenches and to a method for producing a semiconductor circuit arrangement from a thinned semiconductor substrate by means of separating trenches.

BACKGROUND

In the production of semiconductor circuit arrangements (chips), round semiconductor wafers having a thickness of hundreds of μm serve as starting material. From this material, the individual components are produced simultaneously at the surface to a layer depth of several μm by means of various process steps. In the first stages of the fabrication sequence, the chips are thus arranged in matrix-type fashion on the wafer and interconnected by substrate material.

Standard separating methods are usually used for singulating the chips into independent components. A sawing step has predominantly been used hitherto for chip singulation. In this case, a very thin saw blade is used to sever the region between the components on the substrate carrier.

Besides the sawing technique described, recently other techniques have also been employed for chip singulation. One example thereof is the use of the laser cutting method for chip singulation.

Another method is based on the "dicing-before-grinding method" wherein the chips are singulated by forming separating trenches having a specific depth in the wafer and then thinning the wafer on the rear side as far as said separating trenches.

SUMMARY

Embodiments relate generally to a method for dividing a semiconductor substrate, wherein a semiconductor substrate is provided, at least one separating trench is produced in a front side of the semiconductor substrate, a layer is produced at least at the bottom of the at least one separating trench, the semiconductor substrate is thinned at a rear side of the semiconductor substrate at least as far as the layer at the bottom of the at least one separating trench, and the layer is severed in order to divide the semiconductor substrate into individual pieces.

Some embodiments relate to a method for producing a semiconductor circuit arrangement, wherein a semiconductor substrate is provided, at least two semiconductor circuit structures are formed at a front side of the semiconductor substrate, at least one separating trench is produced at the front side of the semiconductor substrate between the at least two semiconductor circuit structures, a layer is produced at least at the bottom of the separating trench, the semiconductor substrate is thinned at a rear side of the semiconductor substrate at least as far as the layer at the bottom of the separating trench, a further layer is produced at the rear side of the thinned semiconductor substrate, and the layer and the further layer are severed in order to produce a plurality of individual semiconductor circuit arrangements.

DETAILED DESCRIPTION

Before embodiments are explained in more detail below with reference to the figures, it is pointed out that identical elements are provided with the same or similar reference symbols in the figures, and that a repeated description of said elements is omitted.

However, the invention is not restricted to the embodiments specifically described, but rather can be modified and altered in a suitable manner. It lies within the scope of the invention to combine individual features and combinations of features of one embodiment with features and combinations of features of another embodiment in a suitable manner in order to obtain further embodiments according to the invention.

FIG. 1 shows in excerpts a method for dividing a semiconductor substrate.

Figure 1A:
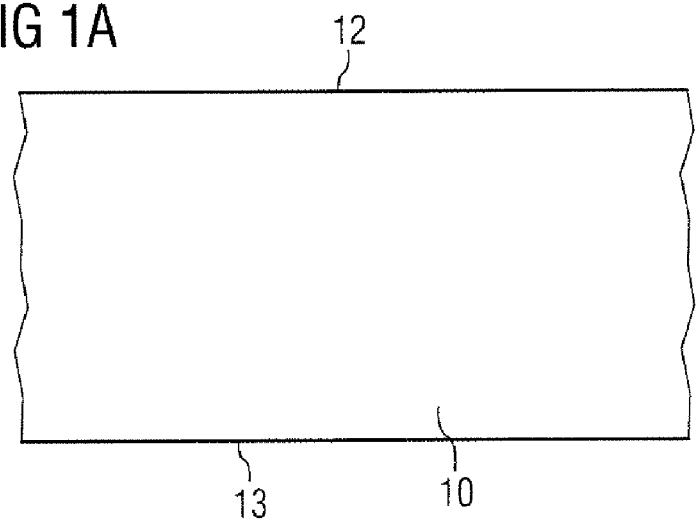
FIG. 1 shows a method for dividing a semiconductor substrate on the basis of schematic cross-sectional views 1a to 1e.

Firstly, a semiconductor substrate 10 is provided, as illustrated in FIG. 1a. Depending on the technology generation, the semiconductor substrate 10 can be a commercially available semiconductor wafer having a wafer diameter of e.g. 6 inches, 8 inches or 300 mm.

Figure 1B:
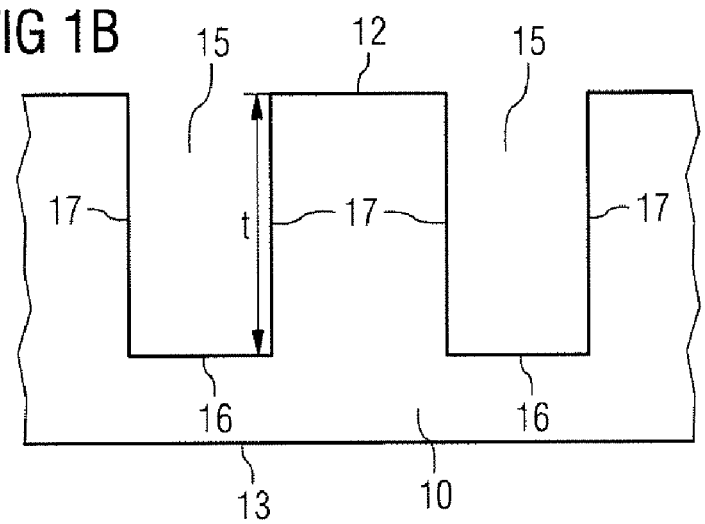

As illustrated schematically in FIG. 1b, separating trenches 15 are produced in a front side 12 of the semiconductor substrate 10. The separating trenches 15 have a predetermined trench depth t and end in the semiconductor substrate 10.

Figure 1C:
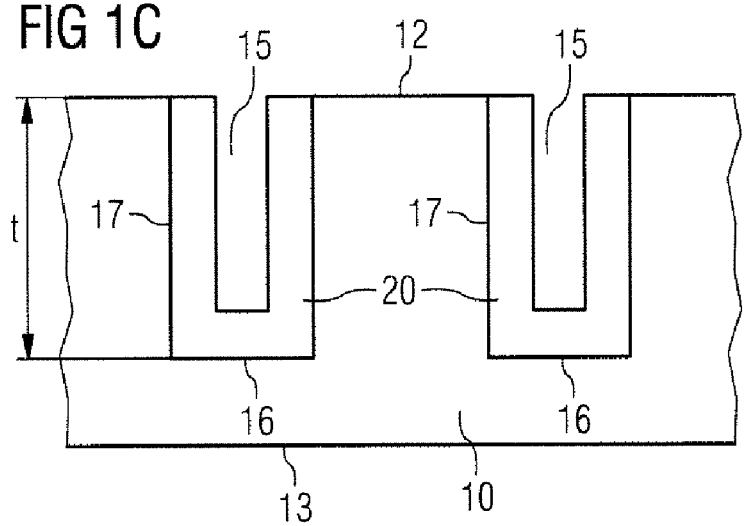

In the separating trenches 15, as shown in FIG. 1c, a layer 20 is produced at least at the bottom 16 of the separating trenches 15. However, the layer 20 can also extend over the sidewalls 17 of the separating trenches and (in a form not illustrated) on the surface 12 of the semiconductor substrate 10.

The layer 20 is generally formed by a different material from the semiconductor substrate 10. Thus, by way of example, the layer 20 can be an oxide produced by thermal oxidation of the semiconductor substrate 10 or a deposited nitride. The layer is produced for example with a layer thickness in the range of 200 nm to 700 nm.

The semiconductor substrate 10 is then thinned at a rear side 13 of the semiconductor substrate 10 at least as far as the layer 20 at the bottom 16 of the separating trenches 15. FIG. 1d shows the result of the thinning process.

As an alternative, the thinning process can also be effected in part right into the layer 20.

For thinning, use is made of the CMP method (Chemical Mechanical Polishing), for example a customary polishing method in wafer processing in order to uniformly remove very thin layers. In this case, the layer 20 serves as a stop layer for the thinning process. An exactly defined semiconductor substrate thickness can thus be set.

As shown in FIG. 1e, after thinning, the semiconductor substrate 10 is divided into individual pieces 25, 25', 25" by the severing of the layer 20 at the bottom 16 of the separating trenches 15.

The severing is effected at least in part either mechanically, for example by means of a water jet and/or simply by means of breaking off with the aid of a force acting on the individual segments 25, 25', 25", or thermally, for example by means of a laser beam, or chemically, for example by means of an HF etch in the case of $SiO_2$ as layer material.

The layer at the bottom of the separating trenches permits exact, reliable and cost-effective thinning to the desired thickness of the semiconductor substrate in which the layer is used as a stop layer of the thinning process. The subsequent division of the semiconductor substrate can then likewise be effected cost-effectively and reliably for example simply by mechanically breaking off the thin layer.

Figure 2A:
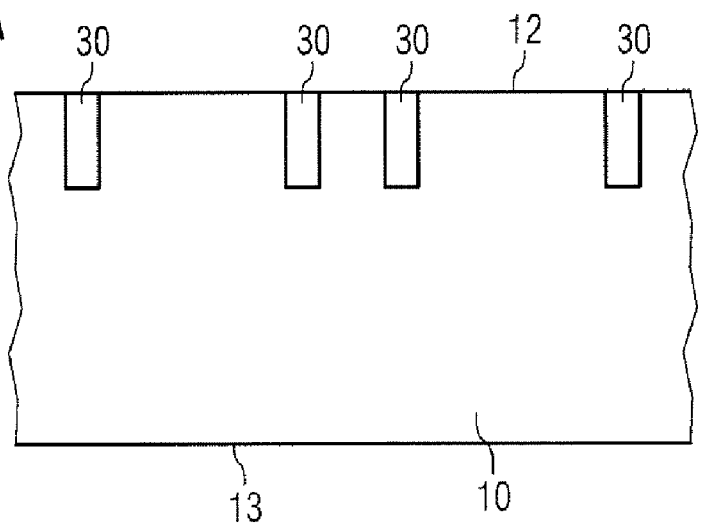
FIG. 2 shows a method for producing a semiconductor circuit arrangement on the basis of schematic cross-sectional views 2a to 2f.
Figure 2B:
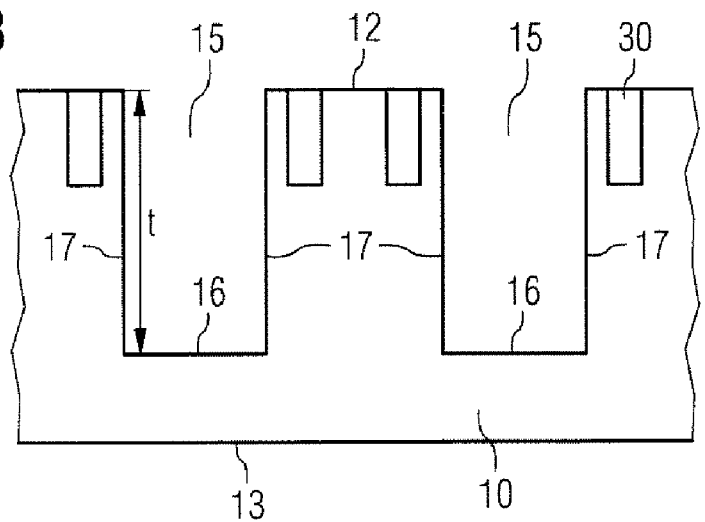
Figure 2C:
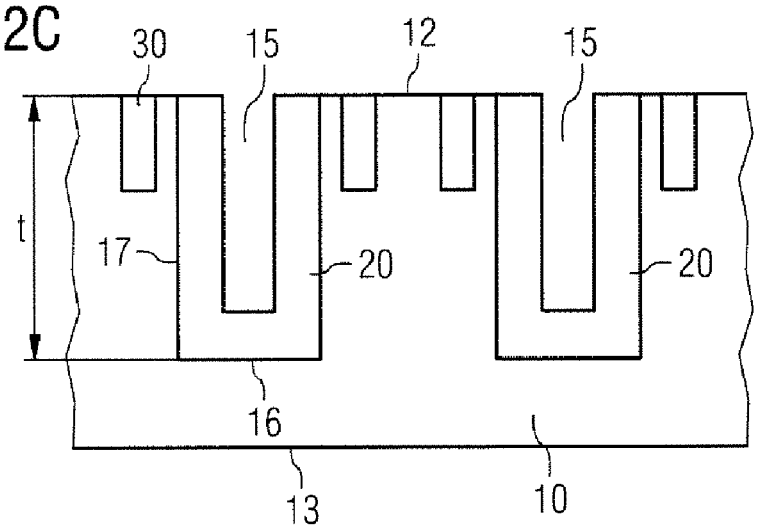

FIG. 2 shows excerpts from a method for producing a semiconductor circuit arrangement as a further exemplary embodiment to the invention.

The method steps for producing a semiconductor circuit arrangement in accordance with this exemplary embodiment are very similar to the above-described exemplary embodiment for dividing a semiconductor substrate.

Thus, FIGS. 2a to 2d show excerpts from the method for producing a semiconductor circuit arrangement which, as the only difference with respect to the explanations of FIGS. 1a to 1d, have the presence of semiconductor circuit structures 30 at the front side 13 of the semiconductor substrate 10.

The semiconductor circuit structures 30 can comprise for example dopant regions or else cell trenches. By way of example, field plates and/or gate electrodes isolated from the semiconductor substrate 10 by an insulation layer (not illustrated), such as a gate oxide, for example, can be formed in the cell trenches.

These semiconductor circuit structures 30 should be formed with a smaller depth than or at most with the same depth as the trench depth t of the separating trenches 15.

In order to facilitate the production process and for cost reasons, the cell trenches 30 can be produced, for example, in the same process steps as the separating trenches 15. The separating trenches 15 and the cell trenches 30 are generally produced by means of an anisotropic etching process. The separating trenches 15 are formed for example with a larger width than the cell trenches 30. This makes it easier, with regard to anisotropic etching, for example, to form deeper separating trenches 15 in comparison with the cell trenches 30.

In contrast to FIG. 1, a further layer 35 produced at the rear side 13 of the thinned semiconductor substrate 10 can additionally be seen in FIG. 2e. The further layer 35 can be produced from a metal, for example, and forms e.g. the rear side metallization of a vertical semiconductor component.

The further layer 35 is deposited over the whole area on the rear side 13 of the semiconductor substrate 10 including over the separating trenches 15. This is made possible by the layer 20 in the separating trenches 15, which closes off the bottom 16 of the separating trenches 15.

The layer 20 can firstly be used, as already mentioned in the description regarding FIG. 1, as a stop layer for the thinning process of the semiconductor substrate 10. After thinning, however, the layer 20 also serves as a "bridge" or as mechanical cohesion between the otherwise already divided segments of the semiconductor substrate 10.

The further layer 35 can therefore cover the rear side 13 over the whole area, without interruption. Moreover, the bottom 16 of the separating trenches 15 that is closed off by the layer 20 prevents the sidewalls 17 of the separating trenches 15 from being coated with the further layer 35. In the case of such a coating of the sidewalls 17, primarily in the case of a metal coating, there would be the risk of a short circuit between the front side 12 and the rear side 13 of the semiconductor circuit arrangement 50, 50', 50". Consequently, the reliability of the semiconductor circuit arrangement 50, 50', 50" is increased by the layer 20.

FIG. 2f illustrates the final production of the semiconductor circuit arrangements 50, 50', 50". In this case, the layer 20 and the further layer 35 are severed along the separating trenches 15, which leads to the singulation of the semiconductor circuit arrangements 50, 50', 50" produced in a plurality in the semiconductor substrate 10. The severing of the layer 20 and of the further layer 35 can likewise be effected, as described with regard to FIG. 1, by at least partial mechanical, thermal or chemical processing of the layer 20 and the layer 35.

By virtue of the fact that the layer, even after the thinning, still supplies a cohesion of the semiconductor substrate and still closes off the separating trenches at the rear side of the semiconductor substrate, for example a rear side metallization can be applied effectively and reliably on the rear side of the semiconductor substrate. The singulation is then likewise effected cost-effectively and reliably for example simply by mechanically severing the layer and the rear side metallization.

In an embodiment that is not illustrated, the separating trench 15 can also be partly or completely filled with a further filling material, which is then likewise severed or removed during the separation of the semiconductor substrate 10.

In an embodiment that is likewise not illustrated, a film can be adhesively bonded to the front side 12 of the semiconductor substrate 10 during the thinning process in order to ensure a further mechanical stability. The singulation of the semiconductor circuit arrangements 50, 50', 50" can be effected for example during removal from the film by virtue of the mechanical forces required for this bringing about the severing of the layer 20 and the layer 35.

It should again be mentioned at this point that the embodiments described are intended merely to illustrate the invention by way of example and cannot be interpreted as exhaustive embodiments. Moreover, it should also be pointed out here that the figures should also be interpreted only as schematic drawings which are not true to scale and do not reflect the true dimensions.

The invention claimed is:

1. A method for producing a semiconductor circuit arrangement, comprising:
   providing a semiconductor substrate;
   forming semiconductor circuit structures at a front side of the semiconductor substrate;
   producing at least one separating trench at the front side of the semiconductor substrate between the semiconductor circuit structures;
   producing a layer at least at the bottom of the separating trench; thinning the semiconductor substrate at a rear side of the semiconductor substrate at least as far as the layer at the bottom of the separating trench;
   producing a further layer at the rear side of the thinned semiconductor substrate; and
   severing the layer and the further layer in order to produce a plurality of individual semiconductor circuit arrangements,
   wherein at least one cell trench is formed as a semiconductor circuit structure, and the at least one separating trench and the at least one cell trench are produced in the same process step.

2. The method according to claim 1, wherein the semiconductor circuit structures are formed at the front side of the semiconductor substrate with a smaller depth than or at most with the same depth as a trench depth t of the at least one separating trench.

3. The method according to claim 1, wherein the at least one separating trench and the at least one cell trench are produced by means of an anisotropic etching process.

4. The method according to claim 1, wherein the at least one separating trench is formed with a larger width than the at least one cell trench.

5. The method according to claim 1, wherein the layer is formed by a different material from the semiconductor substrate.

6. The method according to claim 1, wherein the layer is produced by thermal oxidation of the semiconductor substrate.

7. The method according to claim 1, wherein the layer is produced with a layer thickness in the range of 200 nm to 700 nm.

8. The method according to claim 1, in which the layer is also produced at the sidewalls of the at least one separating trench.

9. The method according to claim 1, wherein the thinning of the semiconductor structure is effected by means of a CMP method.

10. The method according to claim 1, wherein the further layer is produced from a metal.

11. The method according to claim 1, wherein the severing of the layer and of the further layer is effected mechanically at least in part.

12. The method according to claim 11, wherein the mechanical separation is effected by means of a water jet and/or by means of breaking off.

13. The method according to claim 1, wherein the severing of the layer and of the further layer is effected thermally at least in part.

14. The method according to claim 13, wherein the thermal separation is effected by means of a laser beam.

15. The method according to claim 1, wherein the severing of the layer and of the further layer is effected chemically at least in part.

16. The method according to claim 15, wherein the chemical separation is effected by means of an HF etch.

* * * * *